(12) United States Patent
Hwang

(10) Patent No.: US 6,424,539 B1
(45) Date of Patent: Jul. 23, 2002

(54) LOW PROFILE GBIC GUIDE RAIL ASSEMBLY

(75) Inventor: Jenq-Yih Hwang, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/910,523

(22) Filed: Jul. 20, 2001

(51) Int. Cl.⁷ .................................................. H05K 5/00
(52) U.S. Cl. ........................ 361/752; 361/753; 361/807
(58) Field of Search ................................. 361/752, 753, 361/685, 807, 810, 825; 439/490

(56) References Cited

U.S. PATENT DOCUMENTS

| | | | | |
|---|---|---|---|---|
| 4,397,513 A | * | 8/1983 | Clark et al. | 339/91 R |
| 4,939,623 A | * | 7/1990 | Equi et al. | 361/399 |
| 6,094,352 A | * | 7/2000 | Reddy et al. | 361/753 |
| 6,215,666 B1 | * | 4/2001 | Hileman et al. | 361/752 |
| 6,241,534 B1 | * | 6/2001 | Neer et al. | 439/76.1 |
| 6,264,499 B1 | * | 7/2001 | Costello et al. | 439/490 |

* cited by examiner

Primary Examiner—Kamand Cuneo
Assistant Examiner—Tuan Dinh
(74) Attorney, Agent, or Firm—Wei Te Chung

(57) ABSTRACT

An assembly for supporting a GBIC guide rail on a PCB is disclosed. The GBIC guide rail has a housing and support members sideways-extending from the housing, each supporting member having a support post. The PCB defines a cutout for partially receiving and accommodating the housing therein and a plurality holes for receivingly engaging the support posts thereby supporting the GBIC guide rail in the cutout forming a low profile assembly.

1 Claim, 2 Drawing Sheets

LOW PROFILE GBIC GUIDE RAIL ASSEMBLY

BACKGROUND OF THE INVENTION

1. Field of the Invention

The present invention relates to a gigabyte interface converter (GBIC), and in particular to an assembly of a GBIC and a printed circuit board (PCB) forming a low profile configuration.

2. Description of Related Art

An optoelectronic transceiver module provides for bi-directional transmission of data between an optical data media and an electrical interface. Generally, a transceiver module comprises an outer guide rail by which the transceiver module is contained and fixed up.

A stacked GBIC guide rail assembly comprises a lower guide frame and at least one upper guide frame for each supporting one transceiver module therein. The lower guide frame is attached to a surface of the printed circuit board (PCB) with pins extending through and soldered on the PCB. Alternatively, a GBIC guide rail can be fixed to the surface of the PCB by an electrical connector (See U.S. Pat. No. Re 36,820). Disadvantages are associated with such a connection between a guide frame and a PCB. For example, the connection between the lower guide frame and PCB may cause short-circuit of the PCB. Furthermore, the conventional stacked GBIC guide rail takes a large amount of space above the PCB.

It is thus desirable to provide a lower profile stacked GBIC guide rail for overcoming the above problems.

SUMMARY OF THE INVENTION

In accordance with the present invention, an assembly of a GBIC guide rail and a PCB is provided. The GBIC guide rail is partially received in a cutout defined in the PCB and forms sideways-extending support posts for supporting the GBIC guide rail on the PCB, forming a low profile configuration of the GBIC guide rail.

BRIEF DESCRIPTION OF THE DRAWINGS

The present invention will be apparent to those skilled in the art by reading the following description of a preferred embodiment with reference to the attached drawings, in which.

DETAILED DESCRIPTION OF PREFERRED EMBODIMENT OF THE INVENTION

Figure 1:
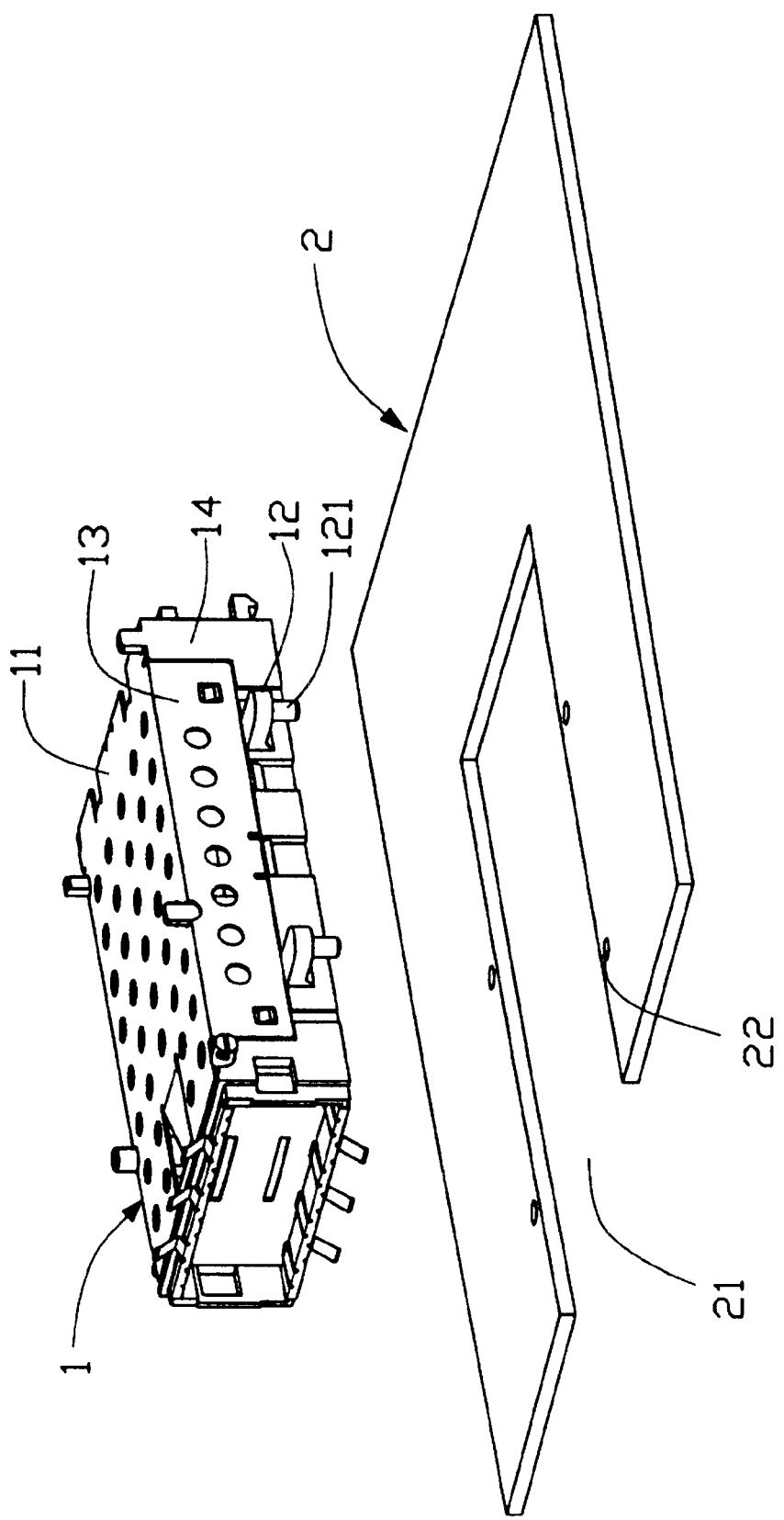
FIG. 1 is a perspective view of a GBIC assembly with a GBIC guide rail detached from a PCB according to the invention.
Figure 2:
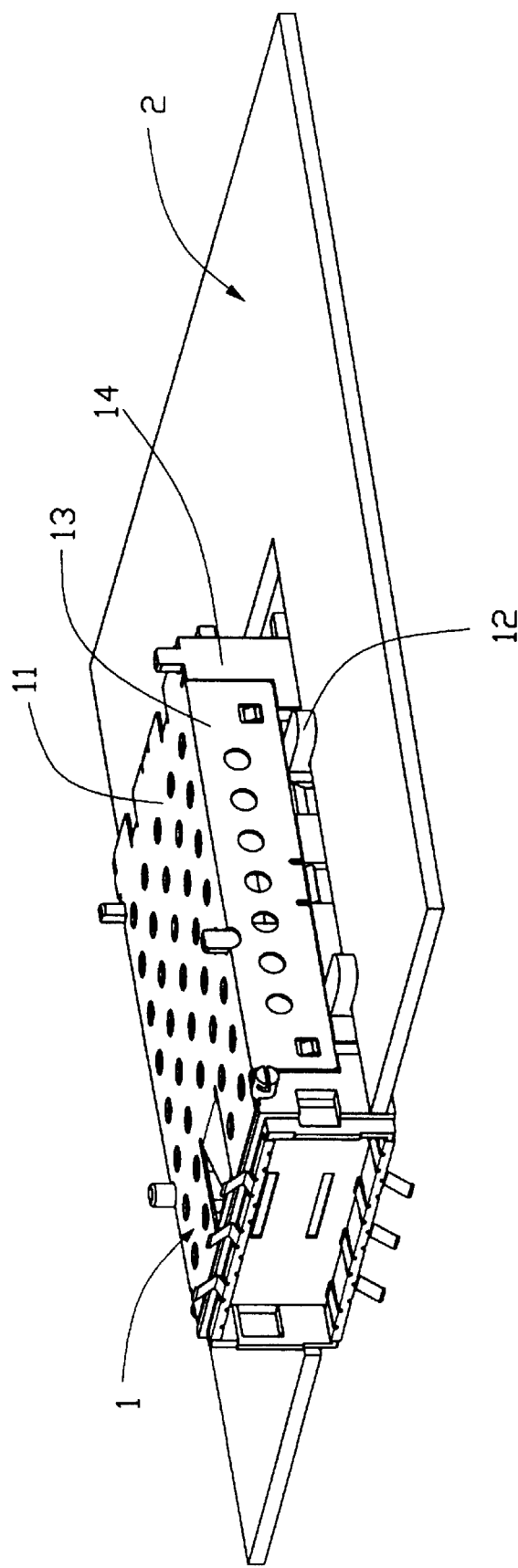
FIG. 2 is an assembled view of FIG. 1.

Referring to the FIGS. 1 and 2, a GBIC assembly according to the invention is shown. The GBIC assembly comprises a GBIC guide rail 1 and a PCB 2. The GBIC guide rail 1 may comprise a single unit as shown in the drawing or more than one unit stacked one another. The GBIC guide rail 1 comprises a housing 11 which may comprise a combination of conductive members such as a U-shaped cover 13 and non-conductive members such as a frame 14, and support members 12 extending from opposite sidewalls of the frame 14 of the housing 11. Each support member 12 has a vertical post 121. The PCB 2 defines a cutout 21 for partially receiving and accommodating the housing 11 and through holes 22 on opposite sides of cutout 21 for receivingly engaging the posts 121 of the support members 12, thereby firmly supporting the GBIC guide rail 1 on the PCB 2 under the condition that the support member 12 is seated upon the PCB 2 and the support member 12 is sandwiched between the PCB 2 and the lower edge of the cover 13.

Since a portion of the housing 11 is located bebw the PCB 2, the overall height of the GBIC guide rail 1 above the PCB 2 is reduced, forming a low profile configuration.

Although the present invention has been described with reference to the preferred embodiment, it is apparent to those skilled in the art that a variety of modifications and changes may be made without departing from the scope of the present invention defined in the appended claims.

What is claimed is:

1. A GBIC support assembly comprising:

a GBIC guide rail comprising an frame and a U-shaped cover;

a plurality of support members sideward extending from sidewalls of the frame;

a post downwardly extending from each of said support members; and a printed circuit board defining a cutout receiving a frame therein, a plurality of holes formed in side portions of said cutout and receiving the corresponding posts, respectively; wherein the support members are positioned between lower edges of the cover and the printed circuit board and support the guide rail on the printed circuit board.

* * * * *